United States Patent [19]

Roberts

[11] 4,061,832
[45] Dec. 6, 1977

[54] POSITIVE-WORKING ELECTRON RESISTS

[75] Inventor: Edward D. Roberts, Purley, England

[73] Assignee: U.S. Philips Corporation, New York, N.Y.

[21] Appl. No.: 668,486

[22] Filed: Mar. 19, 1976

[30] Foreign Application Priority Data

Mar. 20, 1975 United Kingdom ............... 11660/75

[51] Int. Cl.$^2$ .............................................. B05D 3/06
[52] U.S. Cl. .................................... 428/500; 96/35.1; 96/36.2; 96/115 R; 204/159.22; 427/43; 427/44; 526/17; 526/53
[58] Field of Search ............... 427/43, 44, 36; 526/17, 526/53, 291, 292; 250/492; 96/35.1, 36.2, 115 R, 115 P; 428/500; 204/159.22

[56] References Cited

U.S. PATENT DOCUMENTS

| 3,441,545 | 4/1969 | Blatz et al. | 526/17 |
| 3,631,157 | 12/1971 | Vaughn | 526/53 |
| 3,700,647 | 10/1972 | Nakaguchi et al. | 526/291 |
| 3,981,985 | 9/1976 | Roberts | 427/43 |

Primary Examiner—John H. Newsome

Attorney, Agent, or Firm—Frank R. Trifari; Norman N. Spain

[57] ABSTRACT

A positive-working electron resist which comprises a film-forming co-polymer B-D which is cross-linkable by carboxylic acid anhydride groups. The co-polymer B-D is formed from an unsaturated organic compound B and an unsaturated carboxylic acid chloride D. The cross-links are formed by heating a film of the resist in a moist atmosphere, some of the carboxylic acid chloride groups being hydrolysed so as to form carboxylic acid groups, at least some of these carboxylic acid groups reacting with carboxylic acid groups of different molecules of the co-polymer B-D so as to form carboxylic acid anhydride bridge links between these different molecules. The cross-linked material is insoluble in solvents in which the monomers B and D and the co-polymer B-D are normally soluble. Electron irradiation of the cross-linked material breaks the cross-links and restores the readily soluble straight chain forms, so that during development of an irradiated resist pattern, a solvent is used only to dissolve soluble material in the areas which have been irradiated.

4 Claims, 3 Drawing Figures

POSITIVE-WORKING ELECTRON RESISTS

The invention relates to a positive-working electron resist containing a cross-linkable polymeric substance dissolved in an inert solvent, to a method of preparing same and to a method of producing a resist pattern on a substrate using such a resist.

In German Offenlegungsschrift No. 2363092.4 in the name of Applicant, a positive-working electron resist is described which comprises in an inert solvent a mixture of cross-linkable co-polymers A-B and D-E wherein A represents an unsaturated carboxylic acid, B and E represent unsaturated carboxylic acid, B and E represent unsaturated organic compounds which may be the same or different, and D represents an unsaturated carboxylic acid chloride. When this resist is heated, the carboxylic acid groups and carboxylic acid chloride groups react together, hydrogen chloride being eliminated and carboxylic acid anhydride cross-links being formed between the different co-polymer chains.

The present invention provides a positive-working electron resist comprising a cross-linkable polymeric substance dissolved in an inert solvent, characterized in that the polymeric substance consists of a copolymer B-D, wherein B represents an unsaturated organic compound

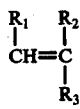

and D represents an unsaturated carboxylic acid chloride.

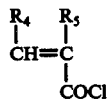

wherein any of $R_1$, $R_2$, $R_4$ and $R_5$, is a hydrogen atom, an aryl group or an alkyl group, $R_3$ represents an alkyl group, a saturated acyloxy group, an aryl group or a —COOR group in which R is an alkyl group, and wherein the co-polymer contains 0.5–30 mol.% of D. The alkyl groups preferably are methyl or ethyl groups. More particularly B is methyl methacrylate and D is methacrylyl chloride. The co-polymer B-D in the electron resist according to the invention comprises a carboxylic acid chloride group. By heating the electron resist in a moist atmosphere some of the carboxylic acid chloride groups are hydrolyzed to form carboxyl groups. The partially hydrolyzed resist thus contains molecules of copolymer B-D, having a carboxylic acid chloride group and molecules having a carboxyl group, and where intermolecular reaction occurs between these functional groups, carboxylic acid anhydride group bridges are formed.

The invention also relates to a method of producing a positive-working electron resist by dissolving a polymeric substance in an inert solvent characterized in that as a polymeric substance a cross-linkable co-polymer B-D, as herein before defined, is used.

A resist pattern may be produced on a substrate by a method wherein the substrate is coated with a cross-linkable polymeric substance in an inert solvent, the coating is dried, heated and irradiated with electrons in accordance with a desired pattern, the irradiated parts are removed by dissolving the irradiated coating in a solvent characterized in that the polymeric substance is a copolymer B-D as hereinbefore defined and in that the heating is performed in a moist atmosphere containing from 0.5–10% by volume of water vapour at a temperature in the range from 150°–250° C so as to form acid anhydride groups between different molecules of the copolymer B-D. The heat treatment in the moist atmosphere may last, for example from 10 minutes to 1 hour. The moist atmosphere may be static or flowing, and may consist (apart from water vapour) for example, of air or nitrogen, but should not contain a constituent such as ammonia, which can react with the resist material. It was found that if the moist atmosphere contained significantly more than 20% by volume of water vapour, substantially all the acid chloride groups of D would by hydrolysed to carboxyl groups and the desired carboxylic acid anhydride group cross-linking could not be obtained, the resist coating so produced being soluble in common solvents.

The unirradiated resist coating is cross-linked and the cross-linked material is insoluble in the solvents in which the co-polymer B-D is normally soluble. Irradiation destroys these carboxylic acid anhydride cross-links restoring the readily soluble substantially straight chain forms. When developing the irradiated pattern in such a resist coating it is only necessary for the developer to distinguish between soluble (irradiated) and insoluble (non-irradiated) regions, and therefore the time and temperature of development is not highly critical. Suitable developing solvents are, for example acetone, methylethyl ketone, methyl isobutyl ketone or toluene, which solvents may also be used as the solvent in which the polymeric substance is dissolved in the resist.

The non-irradiated material can be removed from a substrate (after it has been used as a mask) by soaking it in a mixture of ammonia and a solvent, for example acetone. The ammonia breaks the anhydride group to form amides while the acetone removes the polymer chain material. This permits resists according to the invention to be used on substrates, for example aluminum substrates, which cannot withstand the action of fuming nitric acid, which is often used as a resist remover.

It was found that the resist system according to the instant invention offers the following additional advantages over the system described in the aforesaid Offenlegungsschrift No. 2363092.4.

The resist system of the present invention uses a single co-polymer and is thus simpler to prepare than the known system containing two co-polymers.

The known system of two co-polymers presented some problems of incompatibility of the two co-polymers as the number of cross-linking groups increased. This did not prevent use of this two co-polymer containing system with up to about 20–25% of cross-linking groups, but it sometimes required the resist solution to be diluted to such an extent that thick (2 μm) smooth films could not be applied on one coating operation. It was found that thick smooth films of the resist according to the invention can be applied in a single operation.

It was found that the methyl methacrylate-methacryloyl chloride resist system according to the invention has a greater heat resistance than the systems described in the said Offenlegungsschrift. In the present system deformation of irradiation pattern profiles did not occur until the patterns had been subjected to temperatures 20° C–30° C higher than temperatures at which similar patterns of the two co-polymer system resist deformed.

Some embodiments of the invention will now be described with reference to the following examples and to the accompanying diagrammatic drawings, in which.

EXAMPLES

Methacrylyl chloride was prepared as follows:

51 mls of phosphorus trichloride was added to 180 mls methacrylic acid and the mixture was stirred for 1 hour at 75° C. The upper layer of the reaction product was separated and was fractionally distilled at reduced pressure and a fraction was collected at 40°–42° C at 100 Torr. The density of the methacryloyl chloride obtained was 1.085 g/ccm, the equivalent weight of the metha-crylyl chloride (by titration with alkali) was 53.5 (theoretical 52.25) and it had a chloride content of 34.56% by weight (theoretical 33.97%).

Immediately before preparation of a co-polymer, the required quantities of methyl methacrylate and methacrylyl chloride were redistilled in order to ensure the absence of the respective homopolymer and/or inhibitors.

Measured quantities of methyl methacrylate (MMA), methacrylyl chloride (MAC), azoisobutyronitrile (AIBN) and methyl isobutyl ketone, (MIBK), were stirred in a flask fitted with a reflux condenser. The flask was immersed in a boiling water bath. Additions of methacryloyl chloride were made to the reaction mixture at five minute intervals, and five minutes after the last addition the boiling water bath was replaced by a cold water bath. When the reaction mixture reached room temperature, 25 mls methyl isobutyl ketone was added to reduce the viscosity of the clear polymer solution. It was then added dropwise to about 300 mls ether which was stirred rapidly, and the polymer was precipitated in a flocculent form. It was filtered, washed with ether and dried under vacuum at 60° C.

TABLE I

| mol.% MAC required | 5 | 10 | 15 | 20 | 25 | 30 |
|---|---|---|---|---|---|---|
| Initial charge mls MAC | 0.50 | 1.10 | 1.85 | 2.79 | 3.73 | 5.58 |
| mls MMA | 23.75 | 23.75 | 23.75 | 23.75 | 23.75 | 23.75 |
| g AIBN | 0.125 | 0.125 | 0.125 | 0.125 | 0.125 | 0.125 |
| mls MIBK | 12.5 | 12.5 | 12.5 | 12.5 | 12.5 | 12.5 |
| mls MAC added at 5 mins | 0.13 | 0.25 | 0.29 | 0.39 | 0.48 | 0.58 |
| 10 mins | 0.11 | 0.22 | 0.25 | 0.34 | 0.41 | 0.54 |
| 15 mins | 0.11 | 0.22 | 0.31 | 0.43 | 0.52 | 0.73 |
| 20 mins | 0.10 | 0.21 | 0.33 | 0.47 | 0.57 | 0.80 |

The purpose of adding methacryloyl chloride during the preparation of the co-polymer was to produce a co-polymer having a controlled composition.

Figure 1:
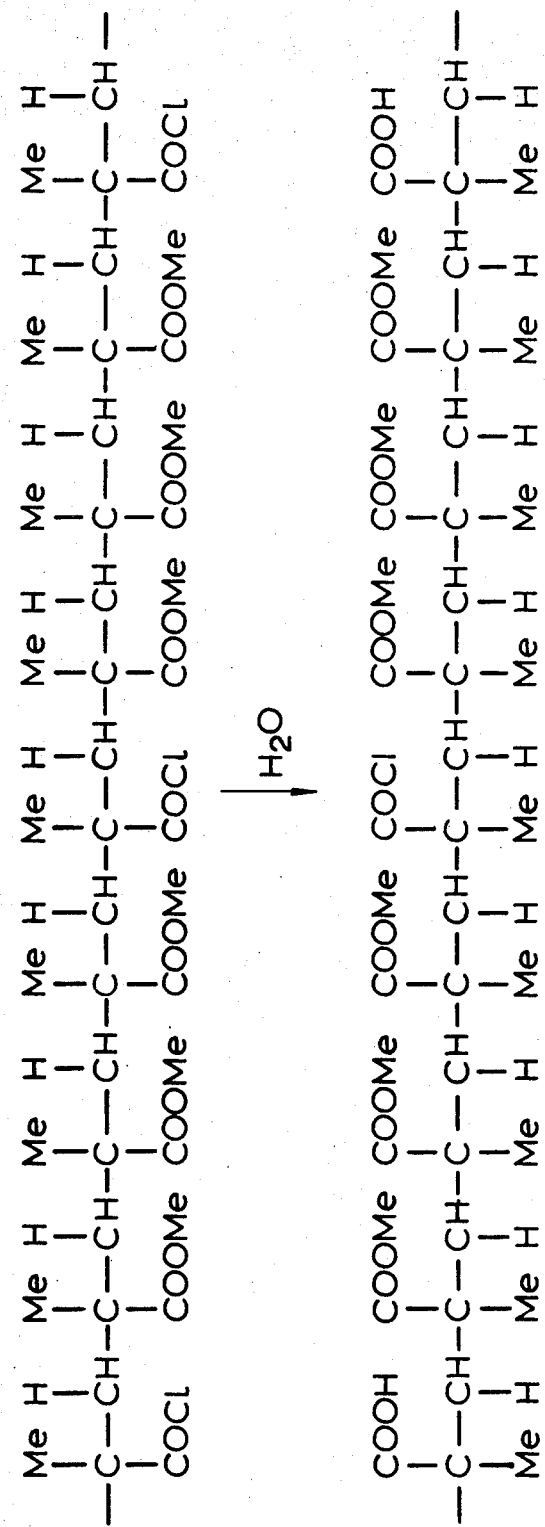
FIG. 1 shows schematically the formation of carboxylic acid groups in the co-polymer B-D by hydrolysis of carboxylic acid chloride groups by water vapour.
Figure 2:
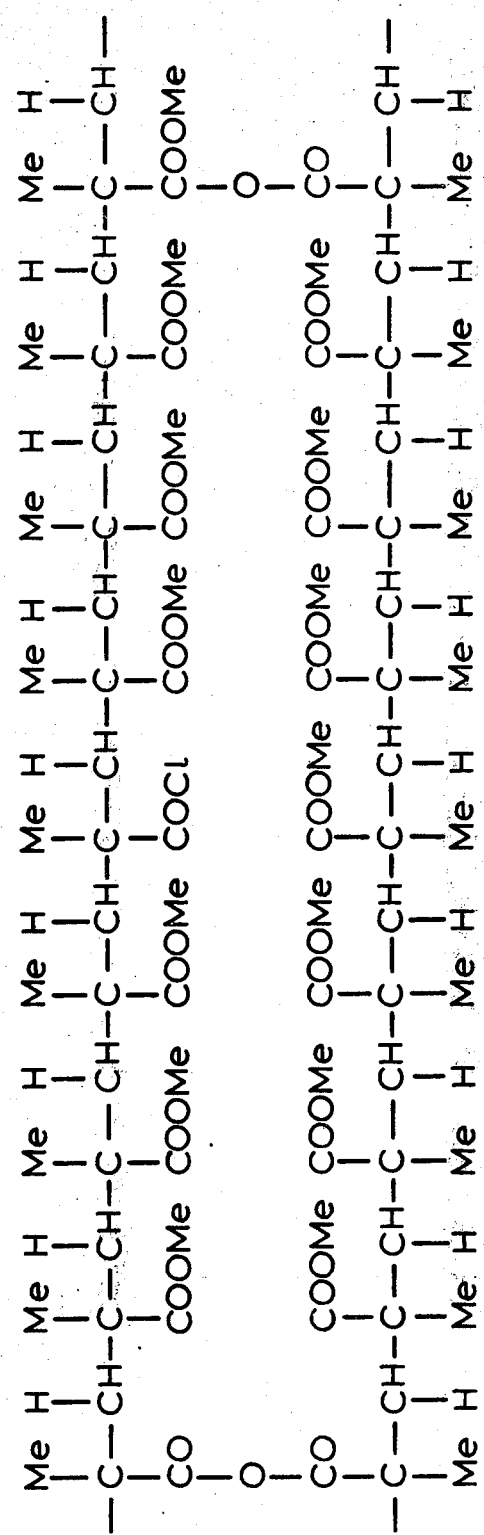
FIG. 2 shows schematically the formation of carboxylic acid anhydride groups in a two-dimensional arrangement by reaction between the carboxyl groups with the carboxylic acid chloride groups, the cross-links are in fact formed in a three-dimensional arrangement, and FIGS. 3 and 4 schematically show a resist coating during irradiation and after development respectively.
Figure 3:
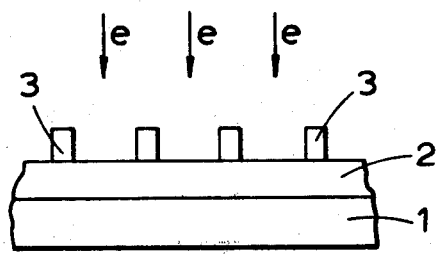

A solution was prepared consisting of 1 part by weight of an MAC-MMA co-polymer containing 10 mol.% of MAC in 5 parts by weight of methyl isobutyl ketone, and films were prepared on silicon slices by applying a solution of the MMA-MAC co-polymer to a silicon slice 1 (FIG. 3) and centrifuging the excess material off at 3,000 r.p.m. The dried centrifuged film was normally about 1 μm thick and was still soluble in common solvents, for example acetone or methyl isobutyl ketone. The slice 1 bearing a film 2 of the MAC-MMA copolymer as described supra was heated at 175° C in a stream of nitrogen which contained 2.5% by volume of water vapour and flowed over the slices at a rate of 700 mls per minute.

Figure 4:
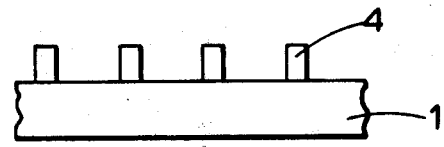

It was found that by using nitrogen streams saturated at 0°, 20°, 40°, 50° or 60° C with water vapour, the cross-linked coatings 2 (FIG. 3) obtained were totally insoluble in boiling acetone. The coating 2 of FIG. 3 was irradiated (exposure from 38 to 40 μC/sq.cm.) with 10 kv electrons (using the method described by E. D. Roberts at page 571 of Proc. 3rd Int. Conf. on Electron and Ion Beam Science and Technology, Boston, May 1968) through a fine (1,000 mesh) copper grid 3 of FIG. 3 in loose contact with the cross-linked film 2 of FIG. 3. The irradiated coating was then developed in methyl isobutyl ketone, the irradiated material being washed off, leaving a resist pattern 4 on slice 1, of FIG. 4. Table II below show the irradiation densities (μC/sq.cm.) required to produce patterns in co-polymers having different MAC contents and which have been cross-linked by heating at different temperatures for 15 minutes in a nitrogen stream saturated with water vapour at 20° C.

TABLE II

| Curing temp. (° C) | 160 | 175 | 200 |
|---|---|---|---|
| 5 mol.% MAC | 22 | 32 | 25 |
| 10 mol.% MAC | 38 | 38 | 50 |
| 15 mol.% MAC | 55 | 62 | 53 |
| 20 mol.% MAC | 57 | 57 | 62 |

Table III below illustrates the heat resistance of the resist patterns produced using cross-linked MAC-MMA co-polymers which had been cured at 175° C for 15 minutes before being irradiated with electrons. Resist patterns having undercut edges (which are produced with positive-working resists as a result of back-scattering of electrons) were heated for 15 minutes at different temperatures, and the patterns were examined after this heat treatment with a scanning electron microscope to determine whether or not the undercut edges were still present. Table III indicates whether or not the undercut edges are still present, the undercut edges are not present only if the material forming the pattern has been deformed as a result of the heat treatment.

TABLE III

| Resist | No heat-treatment. | Heated for 15 mins at (° C) | | | | | |
|---|---|---|---|---|---|---|---|
| | | 120 | 140 | 160 | 175 | 200 | 225 |
| 5 mol.% MAC | Yes | Yes | Yes | No | No | — | — |
| 10 mol.% MAC | Yes | — | — | Yes | Yes | Yes | — |
| 15 mol.% MAC | Yes | — | — | Yes | Yes | Yes | No |
| 20 mol.% MAC | Yes | — | — | Yes | Yes | No | — |

A co-polymer of styrene and methacrylyl chloride was prepared by mixing 0.15 mls methacrylyl chloride, 19.85 mls styrene monomer, 10 mls methyl isobutyl ketone and 0.1 g azoisobutyronitrile. A flask containing the stirred mixture was placed on a boiling water bath for 5 minutes, and was then cooled to room temperature by immersion in cold water. The reaction product was poured into 200 methanol, the precipitated co-polymer was filtered off and dried at 60° C at 5 Torr. A yield of 1.36 g of dry co-polymer containing 7.37 mol.% of methacryloyl chloride was obtained.

A 15% w/w solution of the co-polymer in methyl isobutyl ketone was prepared, and this solution was used to prepare films about 0.5-0.6 μm thick on silicon slices, excess solution being spun off. Silicon slices bearing these films were heated at 195° or 230° C in a stream of nitrogen which contained 2.5% by volume of water vapour and was flowing at 700 mls per minute. Satisfactory resist patterns were obtained by irradiating the cross-linked coatings obtained with 10 kV electrons at exposure of between 30 and 60 μC/sq.cm., the irradiated material being removed from the silicon slices by washing for 1 minute in methyl isobutyl ketone.

What is claimed is:

1. A positive-working electron resist produced by forming then drying and heating, at a temperature of from 150°-250° C in a moist atmosphere containing from 0.5-20% by volume of water vapor, a coating of an inert solvent solution of a polymeric substance, said polymeric substance consisting essentially of the co-polymer B-D wherein B represents an unsaturated organic compound of the formula

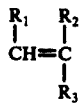

and D represents an unsaturated carboxylic acid chloride of the formula

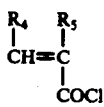

wherein any of $R_1$, $R_2$, $R_4$ and $R_5$, is a hydrogen atom, an aryl group or an alkyl group, $R_3$ represents an alkyl group, a saturated acyloxy group, an aryl group or a —COOR group in which R is an alkyl group, and wherein the co-polymer contains 0.5-30 mol.% of D.

2. The resist of claim 1 wherein the alkyl groups are methyl or ethyl.

3. The resist of claim 1 wherein the B is methyl methacrylate and D is methacrylyl chloride.

4. A method of producing a resist pattern on a substrate comprising coating said substrate with a cross linkable polymeric substance dissolved in an inert solvent, said polymeric substance consisting essentially of the copolymer B - D wherein B represents an unsaturated organic compound of the formula

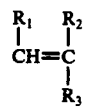

and D represents an unsaturated carboxylic acid chloride of the formula

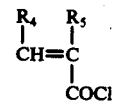

wherein any of $R_1$, $R_2$, $R_4$ and $R_5$, is a hydrogen atom, an aryl group or an alkyl group, $R_3$ represents an alkyl group, a saturated acyloxy group, an aryl group or a —COOR group in which R is an alkyl group, and wherein the co-polymer contains 0.5-30 mol.% of D, drying said resultant coating, heating said resultant dried coating at a temperature of from 150°-250° C in a moist atmosphere containing from 0.5-20% by volume of water vapor so as to form anhydride groups between different molecules of the copolymer B - D, irradiating the resultant coating with electrons according to a desired pattern and dissolving the thus irradiated portions of said coating with a solvent therefor.

* * * * *